(12) United States Patent
Eustis et al.

(10) Patent No.: US 7,007,214 B2
(45) Date of Patent: Feb. 28, 2006

(54) DIAGNOSABLE SCAN CHAIN

(75) Inventors: Steven Michael Eustis, Essex Junction, VT (US); Leah Marie Pfeifer Pastel, Essex, VT (US); Thomas Richard Bednar, Essex Junction, VT (US); Thomas Gregory Sopchak, Williston, VT (US); Jeffery Howard Oppold, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 10/604,194

(22) Filed: Jun. 30, 2003

(65) Prior Publication Data

US 2004/0268195 A1    Dec. 30, 2004

(51) Int. Cl.
  *G01R 31/28*   (2006.01)
  *G06F 7/02*    (2006.01)

(52) U.S. Cl. ...................... 714/729; 714/819
(58) Field of Classification Search ...................... None
  See application file for complete search history.

(56) References Cited

U.S. PATENT DOCUMENTS

| | | | |
|---|---|---|---|
| 5,648,776 A | 7/1997 | Widmer ...................... 341/100 |
| 5,671,258 A | 9/1997 | Burns et al. ................. 375/359 |
| 5,748,902 A | 5/1998 | Dalton et al. ........... 398/200.76 |
| 5,917,364 A | 6/1999 | Nakamura ................... 327/415 |
| 6,046,943 A | 4/2000 | Walker .................. 365/189.05 |
| 6,243,779 B1 | 6/2001 | Devanney et al. .......... 710/129 |
| 6,701,476 B1 * | 3/2004 | Pouya et al. ................. 714/727 |
| 6,941,498 B1 * | 9/2005 | Hartano et al. ............. 714/729 |
| 2001/0027504 A1 | 10/2001 | Devanney et al. .......... 710/129 |
| 2003/0229886 A1 * | 12/2003 | Hasegawa et al. .......... 717/115 |

OTHER PUBLICATIONS

James L. Shafer, et al., *Partner SRLS For Improved Shift Register Diagnostics*, IEEE VLSI Test Symposium, 1992, pp. 198-201, Paper 9.3, IBM East Fiskvill Facility, Route 52, Hopewell Junction, New York 12533.

* cited by examiner

*Primary Examiner*—Christine T. Tu
(74) *Attorney, Agent, or Firm*—Robert A. Walsh; Dillon & Yudell LLP (57) ABSTRACT

A method and system for locating connector defects in a defective scan chain that has a parallel non-defective scan chain on a different wiring level, with both scan chains being laid out in a regular array pattern. A predetermined bit sequence is scanned into the defective scan chain. The contents of the defective scan chain are then parallel shifted into the non-defective scan chain. The contents of the non-defective scan chain is then scanned out and compared with the predetermined bit sequence. The comparison of the scanned out bits with the predetermined bit sequence facilitates locating both physically and logically where a connector defect has occurred in the defective scan chain.

29 Claims, 10 Drawing Sheets

DIAGNOSABLE SCAN CHAIN

BACKGROUND OF INVENTION

1. Technical Field

The present invention relates in general to the field of computers, and in particular to the testing of circuits, including integrated circuits. Still more particularly, the present invention relates to a method and system for locating a defect in a scan chain.

2. Description of the Related Art

A significant expense incurred during the manufacture of integrated circuit (IC) wafers is testing. Such testing generally entails inputting data into a logic circuit on the wafer at a first test access point, and then reading the output results at a second test access point. Often, finer granularity is required to determine whether the logic is functioning properly. That is, a known input data into a logic circuit may result in a desired (expected) output, but the desired output may be the result of multiple offsetting errors. For example, if a "1" is input into three inverters in series, a "0" will be output whether all three inverters are working properly or if only one of the inverters is functioning and the other two are straight shorts. To determine whether the complete logic circuit is functioning properly, data is read out at intermediate logic levels using scan chains, which allow probes to pull off intermediary ults from the logic circuit.

Figure 1:
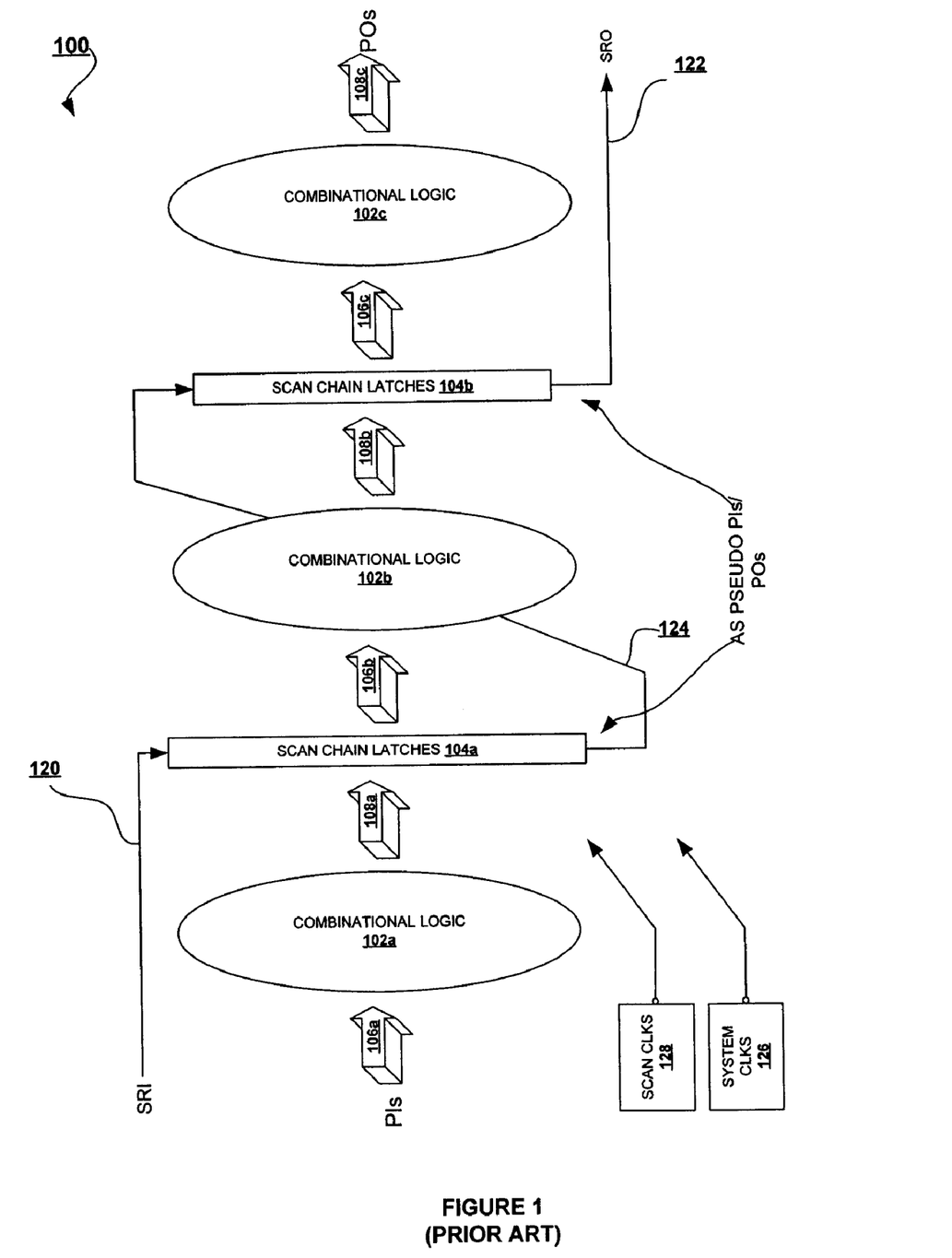
FIG. 1 depicts a high level block diagram of a prior art conventional scan chain.

Referring to FIG. 1, there is depicted a prior art scan chain 100, which includes combinational logic blocks 102a, 102b, and 102c, which represent combinational logic that executes various predetermined logic functions. The combinational logic blocks are interconnected by a scan chain latch circuit 104a, which interconnects combinational logic blocks 102a and 102b, and scan chain latch circuit 104b which interconnects combinational logic blocks 102b and 102c.

Data is written to the combinational logic blocks 102a, 102b, and 102c in a parallel or broadside manner via respective primary input (PI) vectors 106a, 106b, 106c. Data is read from the combinational logic blocks 102a, 102b, 102c in a parallel fashion to the primary output (PO) vectors 108a, 108b, 108c, respectively. The PO vectors 108a, 108b function as PI vectors to respective scan chain latch circuits 104a and 104b.

The scan chain latch circuits 104a and 104b may also be loaded serially to enable testing of the scan chain latches 104a and 104b. In particular, shift register input (SRI) line 120 provides a serial input to scan chain latch 104a. Similarly, shift register output (SRO) line 122 provides an output from scan chain latch 104b. Scan chain latches 104a and 104b are interconnected by serial line 124. Serial line 124 functions as a SRO for scan chain latch 104a and as an SRI for scan chain latch 104b. One or a plurality of system clocks 126 output timing signals to control timing operations of the combinational logic blocks 102 and scan chain latches 104. One or a plurality of scan chain clocks 128 provide timing signals to scan chain latches 104.

While scan chains are useful in determining whether a logic circuit is functioning properly, the scan chains themselves may also be defective. While such defects may be from defective latches in the scan chain, if the latches are robust (designed to ensure their integrity), then defects are primarily in the wiring connecting the latches. Such defects may be opens (a clean break in the wiring), shorts (the wiring touching another wire inadvertently), or stuck-at faults (the wiring touching either ground or voltage). The most problematic wiring defect is a stuck-at fault, since the latch otherwise appears to be functioning properly, albeit with a constant input value. That is, if a connector going into the input of the latch is shorted to ground, then that latch will only be able to latch a logical zero. Likewise, if the input is shorted to voltage, then that latch will only be able to latch a logical one.

Therefore, it would be beneficial to have a method and system that could locate exactly where in the scan chain the connector defect occurred. By finding the exact location of the defect, a more precise manufacture solution for correcting the defect can be determined for the defective scan chain, as well as the overall wiring layer of the IC. Preferably, such an method and system would detect the location of multiple connector defects.

SUMMARY OF INVENTION

The present invention is directed to a method and system for locating connector defects in a defective scan chain that has a parallel non-defective scan chain on a different wiring level, with both scan chains being laid out in a regular array pattern. A predetermined bit sequence is scanned into the defective scan chain. The contents of the defective scan chain are then parallel shifted into the non-defective scan chain. The contents of the non-defective scan chain is then scanned out and compared with the predetermined bit sequence. The comparison of the scanned out bits with the predetermined bit sequence facilitates locating both physically and logically where a connector defect has occurred in the defective scan chain.

The above, as well as additional objectives, features, and advantages of the present invention will become apparent in the following detailed written description.

BRIEF DESCRIPTION OF DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

DETAILED DESCRIPTION

Figure 2A:
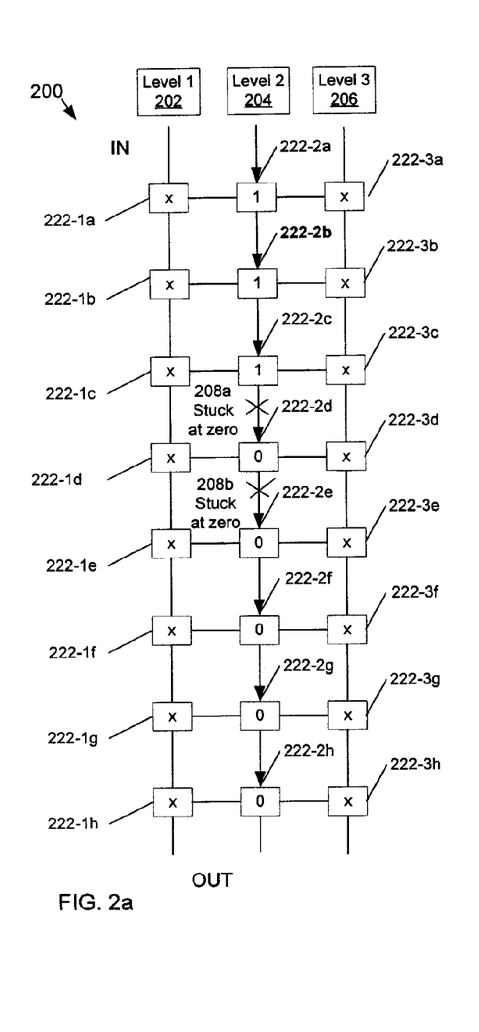
FIGS. 2a–c illustrate a time sequence of a scan chain matrix wherein data is scanned into a second scan chain in series, the data is then parallel scanned into a third scan chain, and the third chain is then serially scanned out to identify a first stuck-at failure in the second scan chain.

With reference now to FIG. 2a, there is illustrated an exemplary scan chain matrix 200 as used in a preferred embodiment of the present invention. Scan chain matrix 200 includes three parallel scan chains 202, 204 and 206, each in parallel with another scan chain each and having associated latches 222 corresponding between the scan chains. Scan chains 202 and 206 have no defects, but scan chain 204 has one or more defects in the connectors 250 between at least one pair of latches 222.

Latches 222 are preferably master/slave latch pairs, but may be any bit or state holding device known to those skilled in the art of integrated circuit (IC) design. In a preferred embodiment, each scan chain is physically wired on a different wiring level of an IC chip or wafer. These wiring levels are preferably on different metal levels, but may be on any different wiring level as understood by those skilled in the art of IC fabrication. Thus scan chain 202 is physically wired on wiring level 1, scan chain 204 is on wiring level 2, and scan chain 206 is on wiring level 3. Latches 222 on different wiring levels are coupled via connectors 224, including the depicted connectors 224a and 224b. Note further that FIG. 2 illustrates scan chain 202 as being contiguous with and parallel connected to scan chain 204, which is contiguous with and parallel connected to scan chain 206. However, in a preferred embodiment, scan chain 202 may be parallel connected to scan chain 206, such that scan chain 202 can be defective and scan chain 206 non-defective for use with the present invention.

Figure 2B:
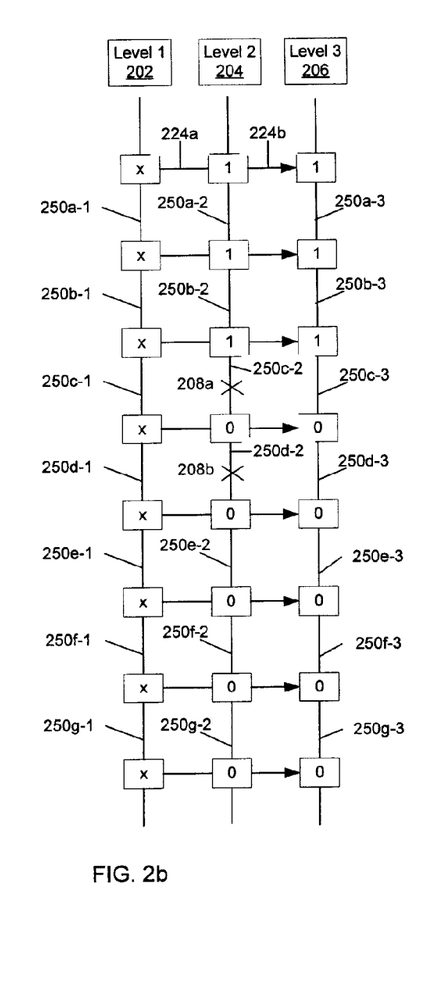
Figure 2C:
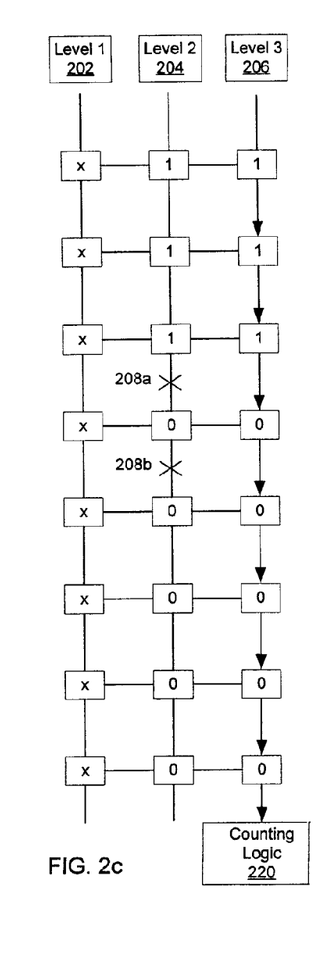
Figure 2D:
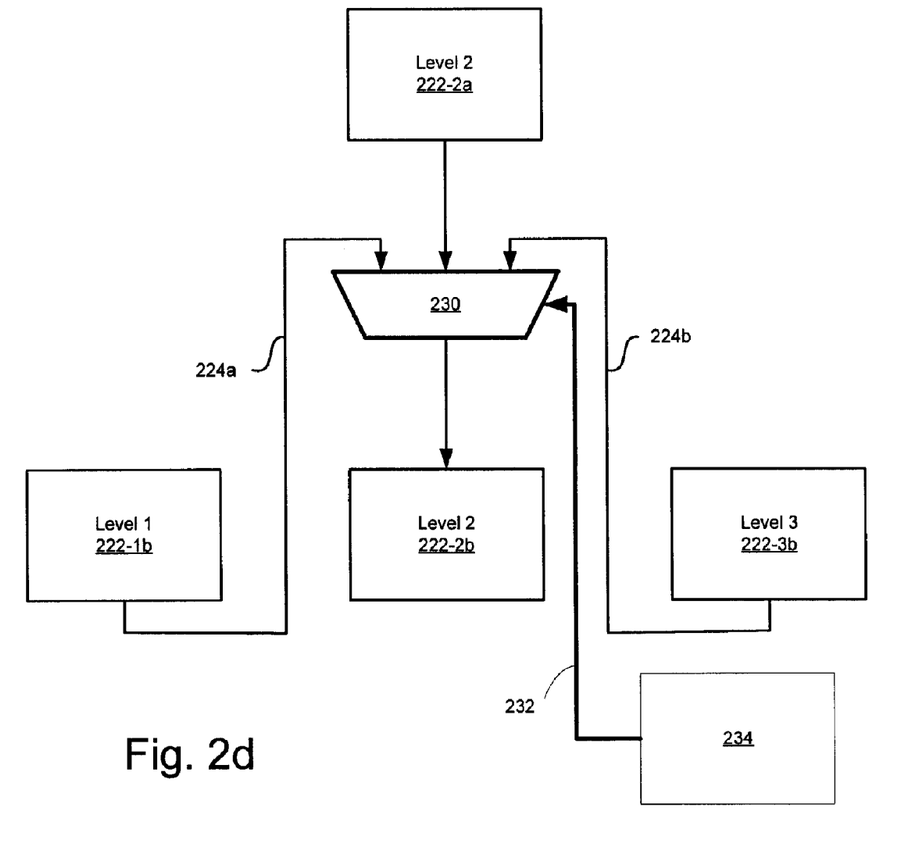
FIG. 2d depicts a preferred input control and data logic circuit that allows for serial and parallel data shifting.
Figure 2E:
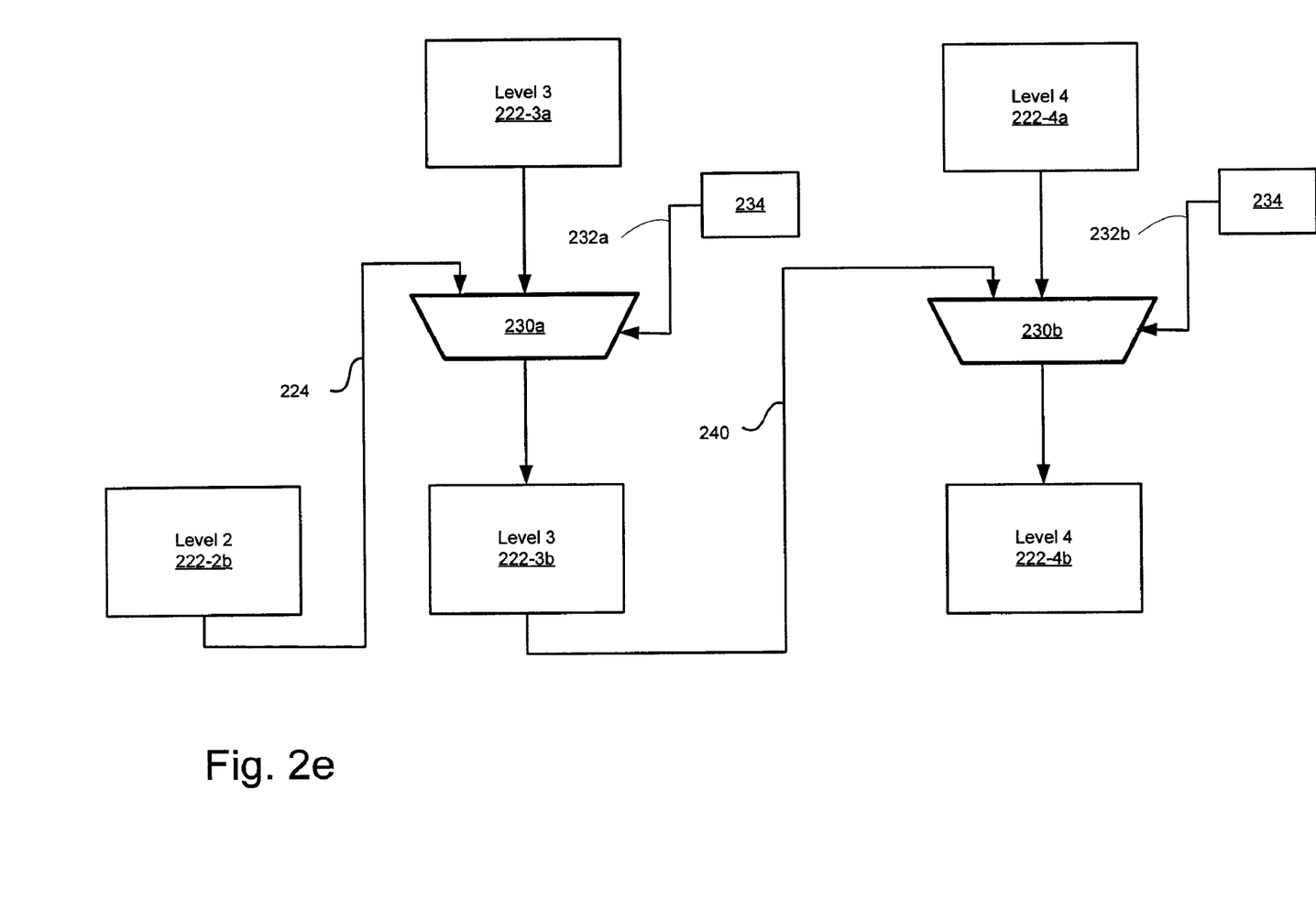
FIG. 2e illustrates a preferred parallel shifting circuit that permits parallel shifting of scan chain data across multiple wiring levels.

In a preferred embodiment, coupling of latches 222 is through a multiplexer (MUX) 230, as shown in FIG. 2d. The outputs of the latch 222-1b from wiring level 1, latch 222-2a from wiring level 2, and latch 222-3b from wiring level 3 are input into MUX 230. Note that latch 222-1b, latch 222-2b and latch 222-3b are in the same row and parallel coupled. Note further that each latch 222 in scan chain matrix has an associated dedicated single MUX 230. The input bit to be latched by latch 222-2b is determined by a signal on selector line 232, which signal is produced by a selector logic 234 that controls whether data is serially shifted through a scan chain (e.g., from latch 222-2a to latch 222-2b) or parallel shifted from one scan chain to another scan chain (e.g., from latch 222-3b or latch 222-1b to latch 222-2b).

Referring again to FIG. 2a, scan chain 204 has two stuck-at defects, a first upstream stuck-at defect 208a and a last downstream stuck-at defect 208b. A stuck-at defect is one in which the input to a latch is "stuck at" either a one ("stuck-at-high" defect in which the input is shorted to a logical high voltage source) or a zero ("stuck-at-low" defect in which the input is shorted to a logical low ground source). For purposes of illustration, all scan chain defects are illustrated as stuck-at-low defects. However, the present invention is also applicable for use with stuck-at-high defects by scanning and shifting alternate signals (ones instead of zeros and zeros instead of ones) as described below.

The first step in determining the location of the first upstream stuck-at failure 208a in scan chain 204 is to scan a series of all ones into scan chain 204. (Note that scan chain 202 is not used in FIGS. 2a–c and 3a–c, but is used as described in FIGS. 4a–c. Note also that "x" denotes a "don't care" state in each latch 222 depicted in the figures.) When the scanned in series of ones reaches the first upstream stuck-at failure 208a, then downstream latches 222-2d–h all latch zeros instead of the scanned in ones. That is, latch 222-2d latches a zero since its input is stuck at (shorted to) ground, and thus all downstream latches 222-2e–h are likewise latched to zero.

The contents of scan chain 204 in latches 222-2a–h are then parallel shifted to scan chain 206 in level 3, as illustrated in FIG. 2b. The parallel shifting is preferably performed using MUX 230 shown in FIG. 2d. The select signal, generated by parallel shifting logic 234, on selector line 232 selects the input to latch 222-3b as that coming from latch 222-2b, thus resulting in a parallel shift of data from scan chain 204 to scan chain 206. Each other latch 222 in scan chain 206 has its own dedicated MUX 230, and thus parallel shifts all data at the same time. That is, scan chain 206 now has a copy of the defective contents of scan chain 204, resulting in ones in the first three upstream latches 222-3a–c and zeros in the last five downstream latches 222-3d–h.

As depicted in FIG. 2c, the contents of scan chain 206 are then scanned out to counting logic 220. Counting logic detects five zeros and then three ones. By counting backwards to the point where the data bits transition from zero to one, the location of first upstream stuck-at failure 208a is identified as being at the connector 250 between latch 222-2c and latch 222-2d. While the steps illustrated in FIG. 2 assume only stuck-at-low wiring defects, it is possible that there may be a combination of stuck-at-low and stuck-at-high wiring defects in the defective scan chain. If so, then identifying the last point where the data bits transition from zero to one will identify the location of the first upstream stuck-at failure.

Figure 3A:
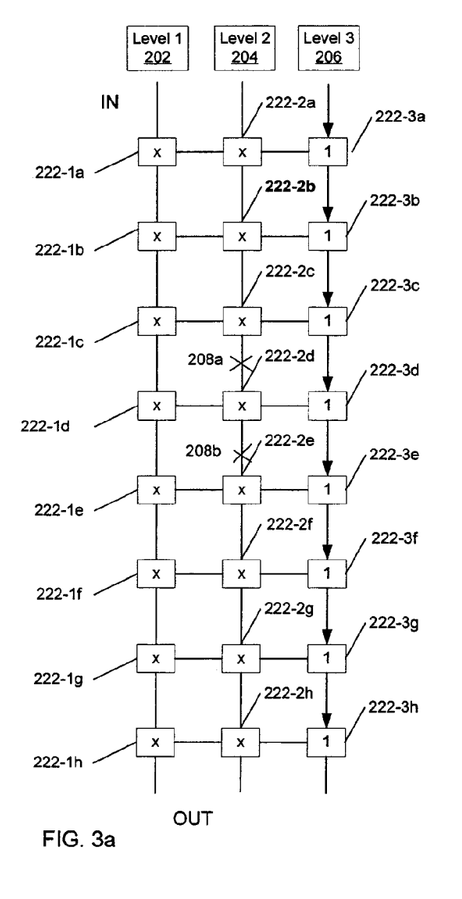
FIGS. 3a–c depict a time sequence of the scan chain matrix wherein data is scanned into the third scan chain in series, the data is then parallel scanned into the second scan chain, and the second chain is then serially scanned out to identify a last stuck-at failure in the second scan chain.
Figure 3B:
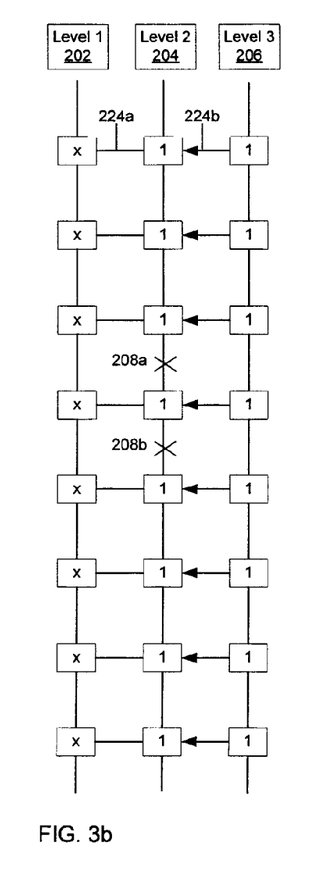
Figure 3C:
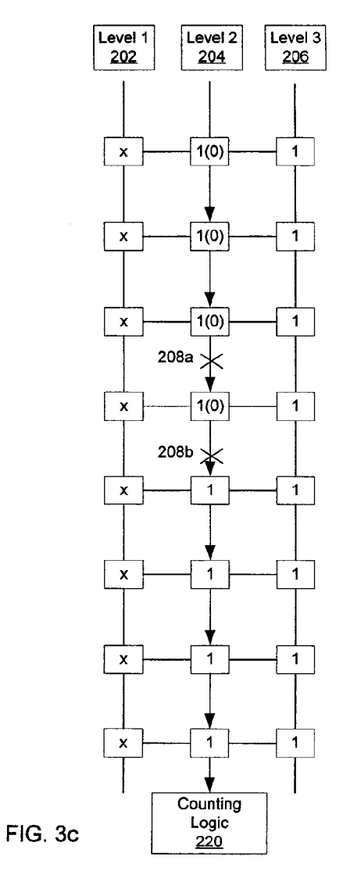

Since first upstream stuck-at failure 208a masks the inputs of all downstream latches 222-2, a second operation, illustrated in FIGS. 3a–c, is necessary to locate last downstream stuck-at failure 208b. As shown in FIG. 3a, all ones are serially shifted into non-defective scan chain 206. As illustrated in FIG. 3b, the contents of scan chain 206 are then parallel shifted, in a similar manner described above in reference to FIGS. 3a–c, from scan chain 206 to scan chain 204. As shown in FIG. 3c, the data in scan chain 204 is then serially scanned out to counting logic 220, which counts the number of ones to determine the location of the last stuck-at failure 208b. In the example described in FIGS. 3a–c, the counting logic 220 will count four ones, and only zeros thereafter, because of the stuck-at failure 208b located between latch 222-2d and latch 222-2e. That is, although latches 222-2a–d were loaded with ones from the parallel shift from scan chain 206, when serially read out the contents of latches 222-2a–d will appear to be zeros (as indicated by the parenthetical zeros in these upstream latches).

Figure 4A:
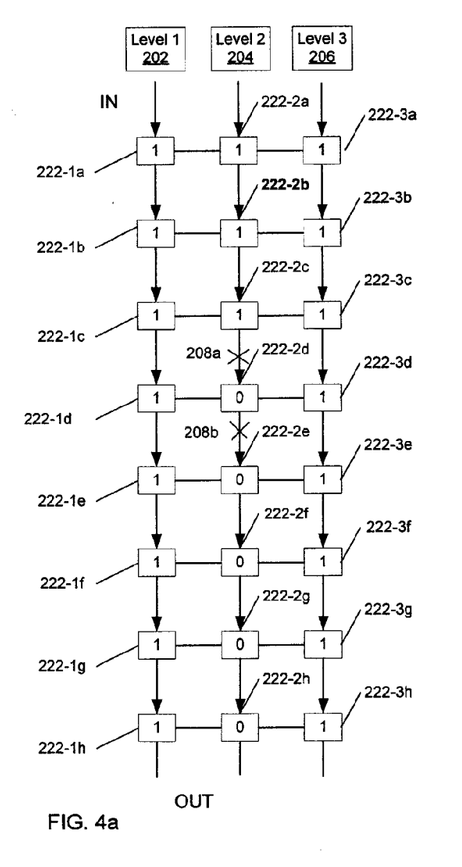
FIGS. 4a–c illustrate a time sequence of the scan chain matrix wherein data is scanned into a first, second and third scan chains, data is parallel scanned from the second to third chains and then the first to second chains, and the second and third chains are then serially scanned out to respectively identify the last and first stuck-at failures in the second scan chain.
Figure 4B:
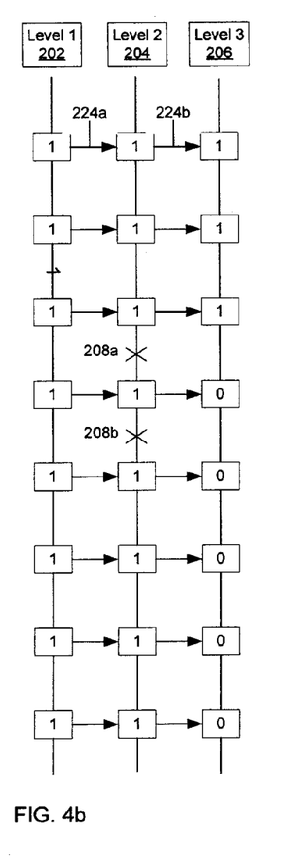
Figure 4C:
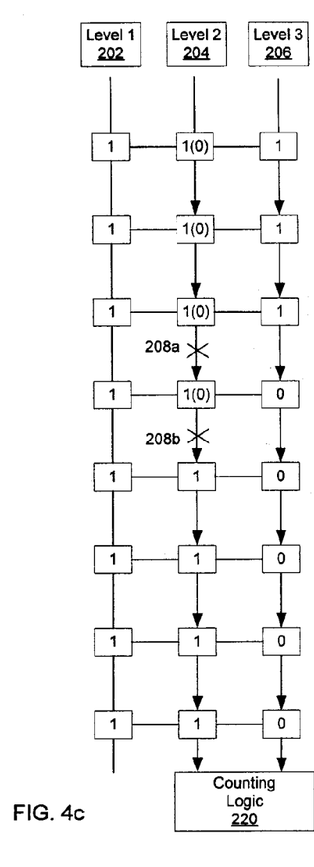

FIGS. 2a–c and FIGS. 3a–c utilize only two scan chains 204 and 206 in two scan/shift iterations to locate the defects 208a and 208b. FIGS. 4a–c illustrate the use of three scan chains in one iteration to accomplish the same result. FIGS. 4a–c depict two non-defective scan chains 202 and 206 and one defective scan chain 204. As shown in FIG. 4a (and still assuming that the defect in scan chain 204 is a stuck-at-low defect), scan chains 202, 204 and 206 are initially serially scanned in with all ones (although latches 222-2d through 202-2h latch zeros dues to stuck-at failure 208a). Scan chain 204 is parallel shifted to scan chain 206 and scan chain 202 is subsequently parallel shifted to scan chain 204 in a manner described above using MUX 230 and selector 234. Finally, as depicted in FIG. 4c, scan chains 204 and 206 are serially shifted out to counting logic 220. The data scanned out of scan chain 204 identifies the location of the last downstream stuck-at failure 208b in a manner described above for FIG. 3c, and the data scanned out of scan chain 206 identifies the location of the first upstream stuck-at failure 208a in a manner described above for FIG. 2c.

For purposes of clarity, FIGS. 2–4 show only three scan chains on different wiring levels. However, in a preferred embodiment of the present invention, more than three parallel scan chain wiring levels are used, such that a bad scan chain is not limited to using only good scan chains on contiguous levels. For example, in FIGS. 2a–c, scan chain 204 on wiring level 2 described as being parallel coupled, using the circuitry shown in FIG. 2d, to scan chain 202 and scan chain 206. However, if both scan chains 202 and 206 are also defective, then scan chain 204 can continue to parallel shift past either scan chain 202 or 206 to another scan chain on another wiring level (not shown in FIGS. 2a–c, 3a–c or 4a–c). Referring then to FIG. 2e, if the scan chain 206 at level 3 is defective, then parallel shifting logic 234 parallel shifts the data in latch 222-2b through MUX 230a at level 3 and latch 222-3b, and on, via connector 240, to MUX 230b and latch 222-4b in a level 4 wiring level. Thus, parallel shifting logic 234 associated with each MUX 230 allows data to continue to parallel shift until the data reaches a non-defective scan chain. Although not shown, it is understood that level 4 latch 222-4b can likewise parallel shift data to level 2 latch 222-2b by shifting data through MUX 230a and level 3 latch 222-3b via an analogous MUX 230 (not shown) associated with level 2 latch 222-2b. Thus, even if a first defective scan chain is contiguous with another second defective scan chain, the data in the first defective scan chain can be parallel shifted to subsequent level scan chains until a non-defective scan chain is reached to receive the parallel shifted data from the first defective scan chain.

Figure 5:
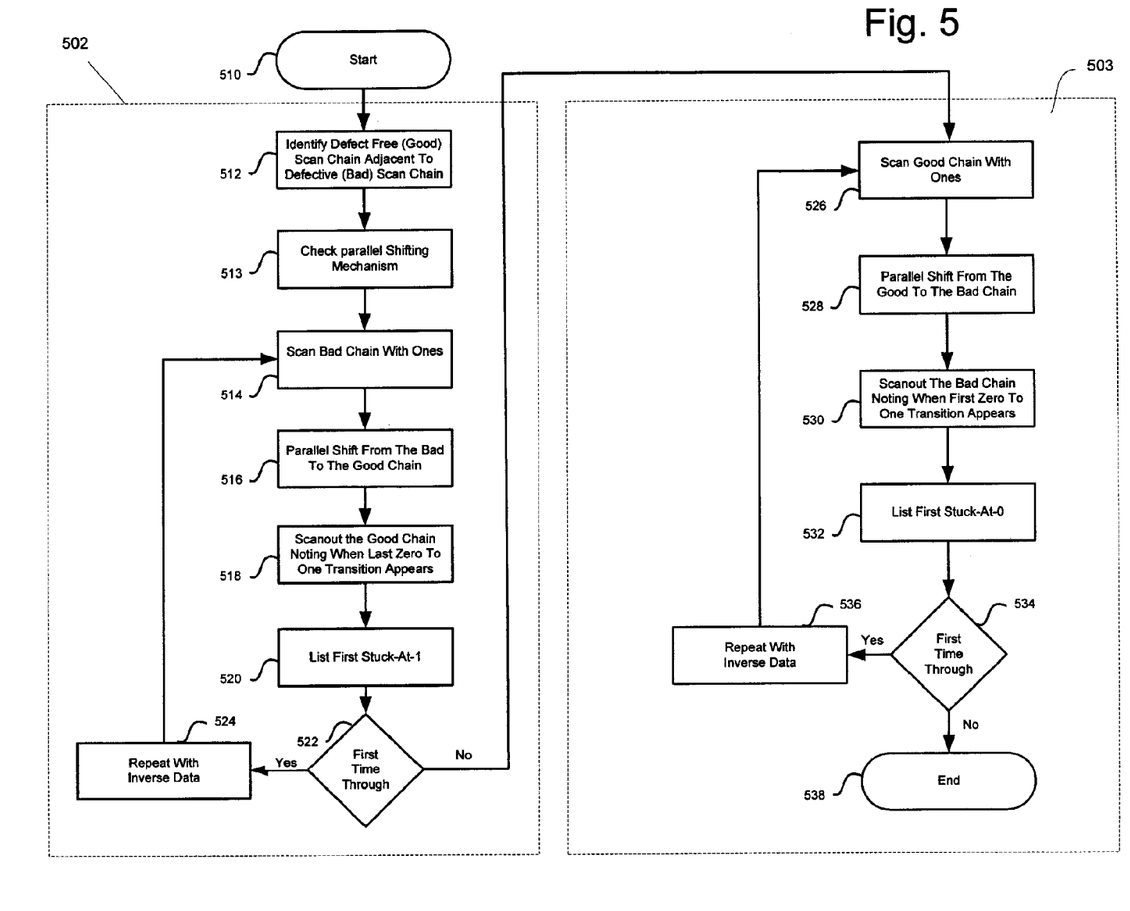
FIG. 5 is a flow-chart describing the process represented graphically in FIGS. 2a–c and FIGS. 3a–c.

FIG. 5 is a flow-chart describing the operations shown in FIGS. 2–3. The operations described within box 502 describe the steps taken to identify first upstream stuck-at failure 208a in a manner shown in FIGS. 2a–c, and the operations shown within box 503 describe the steps taken to identify last downstream stuck-at failure 208b in a manner illustrated in FIGS. 3a–c. Thus, after starting at initiator 510, the defective scan chain 204 is identified (block 512) utilizing any technique known and selected by the user. For example, the user can scan in a known string of bits, either a pattern of different ones and zeros or all ones or all zeros, into the scan chain, then scan out the contents of the scan chain, and then compare the known string of scanned in bits with the scanned out bits ensure that they are the same. If the strings of bits are not the same (assuming no intentional inversions or other intentional modifications of the bits), then there is a defect in the scan chain.

Figure 7:
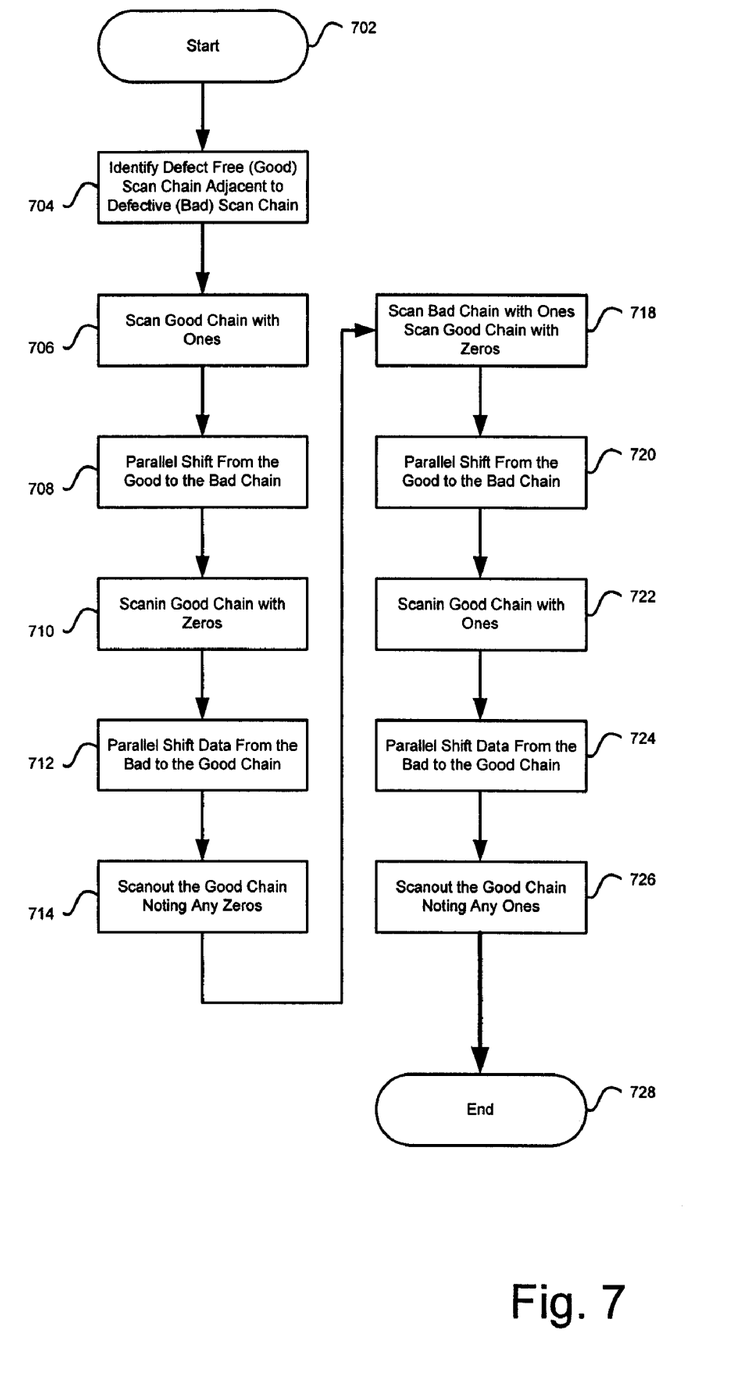
FIG. 7 is a flow-chart describing a process for testing parallel shifting integrity.

Next, the parallel shifting mechanism is checked (block 513), described in a preferred embodiment in further detail in FIG. 7. The defective scan chain is then scanned with all ones (assuming the defect is a stuck-at-low defect), as described in block 514. The data from the defective scan chain is then parallel shifted to a good scan chain (block 516), which is then scanned out to a counter, which notes when the last zero transitions to a one (block 518). This transition identifies the location of the first upstream stuck-at defect 208a (block 520).

The examples depicted in FIGS. 2a–c, 3a–c and 4a–c all assumed that the scan chain defect was a stuck-at-low defect. However, such a defect could be a stuck-at-high defect, in which a connector 240 is shorted to a logical high voltage. If so, then the process described above still will identify the location of the stuck-at defect if the bits scanned in are opposite those described above for a stuck-at-low defect. If the scan/shift process has only searched for stuck-at-low defects through a first time search (decision block 522), then the process is continued for the same scan chain using opposite data bits to search for stuck-at-high defects. Thus, the defective scan chain 204 is now scanned with all zeros (block 514), the contents of the defective scan chain 204 are parallel shifted into non-defective scan chain 206 (block 516), the contents of non-defective scan chain 206 are serially shifted out (block 518), and the counting logic 220 notes the last transition from one to zero (block 520) to identify the location of the first upstream stuck-at-high defect (analogous to the stuck-at-low defect 208a). In the example illustrated, there is only one transition from one to zero. However, if there were multiple stuck-at-low and stuck-at-high defects in the scan chain, then the last transition from one-to-zero is the transition that identifies the location of the first upstream stuck-at-high defect.

Proceeding to blocks 503, there are depicted exemplary steps taken using a preferred embodiment of the present invention to identify a last downstream stuck-at defect in a scan chain, as described above in FIGS. 3a–c. Assume first that the last downstream stuck-at defect is a stuck-at-low defect, such as stuck-at defect 208b. Non-defective scan chain 206 is scanned with all ones (block 526). The data in non-defective scan chain 206 is then parallel shifted into defective scan chain 204 (block 528). The data bits in scan chain 204 are then serially shifted into counting logic 220, noting the point at which the data transitions from one to zero (block 530) to identify the location of the last stuck-at defect (block 532). As in blocks 502, a decision (block 534) is made as to whether the data scan/shifting has been performed before. If not, then the data bits are inverted as in block 502 to locate a stuck-at-high last downstream defect. Thus, the good scan chain 206 is scanned in with zeros (block 526), which are then parallel shifted to the defective scan chain 204 (block 528). The contents of defective scan chain 204 are serially scanned out, noting the transition from zeros to ones (block 530) to identify the location of the last downstream stuck-at-high defect (block 532), which is analogous to the stuck-at-low defect 208b. The process then terminates at terminator block 538. In a manner analogous to that described above for blocks 502, the first transition from one to zero will identify the last stuck-at-high defect if there are multiple stuck-at-high and stuck-at-low defects.

Figure 6:
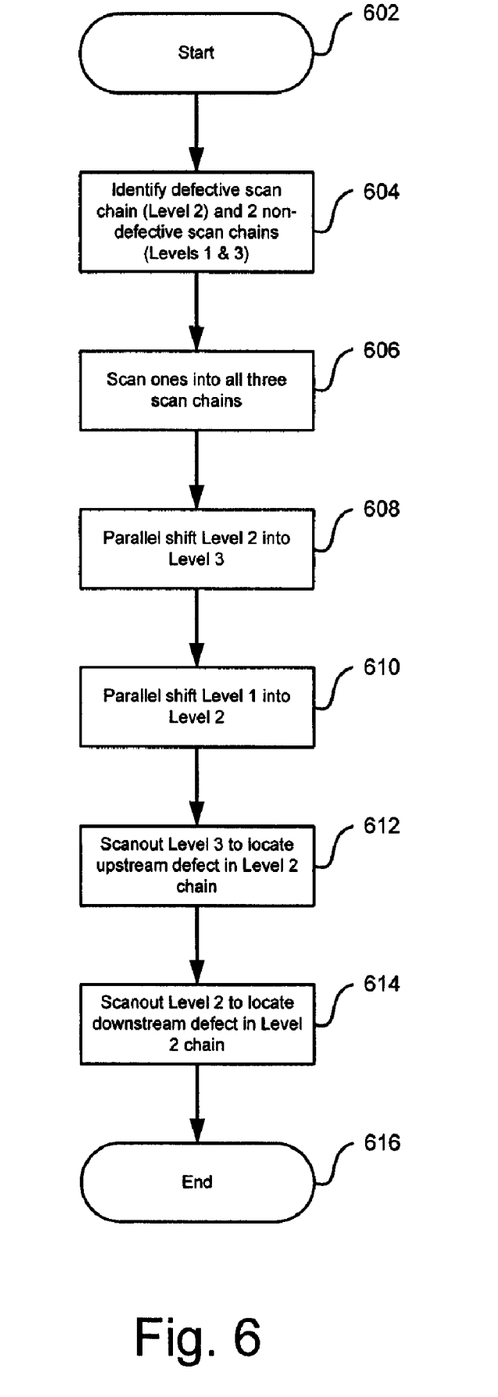
FIG. 6 is a flow-chart describing the process represented graphically in FIGS. 4a–c.

FIG. 6 is a flow-chart describing the operations illustrated in FIGS. 4a–c. After starting at initiator block 602, the defective scan chain is identified, as are two non-defective scan chains (block 604). Ones are then scanned into all three scan chains (block 606), and the contents of scan chain 204 in wiring level 2 are parallel shifted into scan chain 206 in wiring level 3 (block 608), and the contents of non-defective scan chain 202 are parallel shifted into defective scan chain 204 (blocks 608 and 610). The contents are then serially scanned out of scan chain 206 to identify the location of first upstream stuck-at-low defect 208a (block 612) and out of scan chain 204 to identify the location of last downstream stuck-at-low defect 208b (block 614). Note that in a preferred embodiment, the bits are inverted in the process shown in FIG. 6 in a manner analogous to that shown in blocks 524 and 536 in FIG. 5 to identify any stuck-at-high defects.

The described process and system assume that the parallel shifting system, shown in an exemplary embodiment in FIG. 2d, is functioning properly. To ensure this integrity, a preferred embodiment of the present invention includes the steps described in FIG. 7. After starting at initiator block 702, the defect free scan chain and the defective scan chain are first identified (block 704), utilizing any known process, such as scanning in a known string of bits, either as a pattern of different ones and zeros or all ones or all zeros, and then scanning out the known string of bits and comparing the scanned out bits with the scanned in bits to ensure that they are the same.

The good scan chain is scanned with all ones (block 706). The ones in the good scan chain are then parallel shifted into the bad scan chain (block 708), and then the good scan chain is scanned in with all zeros (block 710). The contents of the bad scan chain (containing all ones if the parallel shifting mechanism is properly working) are then scanned into the good scan chain (block 712), whose contents are then scanned out, noting the presence of any zeros (block 714) which would indicate that the parallel shifting mechanism has a stuck-at defect somewhere between the latches in the bad scan chain and the good scan chain.

The process then tests for stuck-at-high defects in the parallel shifting mechanism. Thus at block 718, the good scan chain is scanned with all zeros (block 718), the contents of the good scan chain are parallel shifted into the bad scan chain (block 720), all ones are scanned into the good scan chain (block 722), the contents of the bad scan chain (should be all zeros) are scanned into the good scan chain (block 724), and the contents of the good scan chain are then scanned out, noting any ones (indicating a stuck-at-high defect between the bad scan chain and the good scan chain). The process then terminates at block 728.

Figure 8:
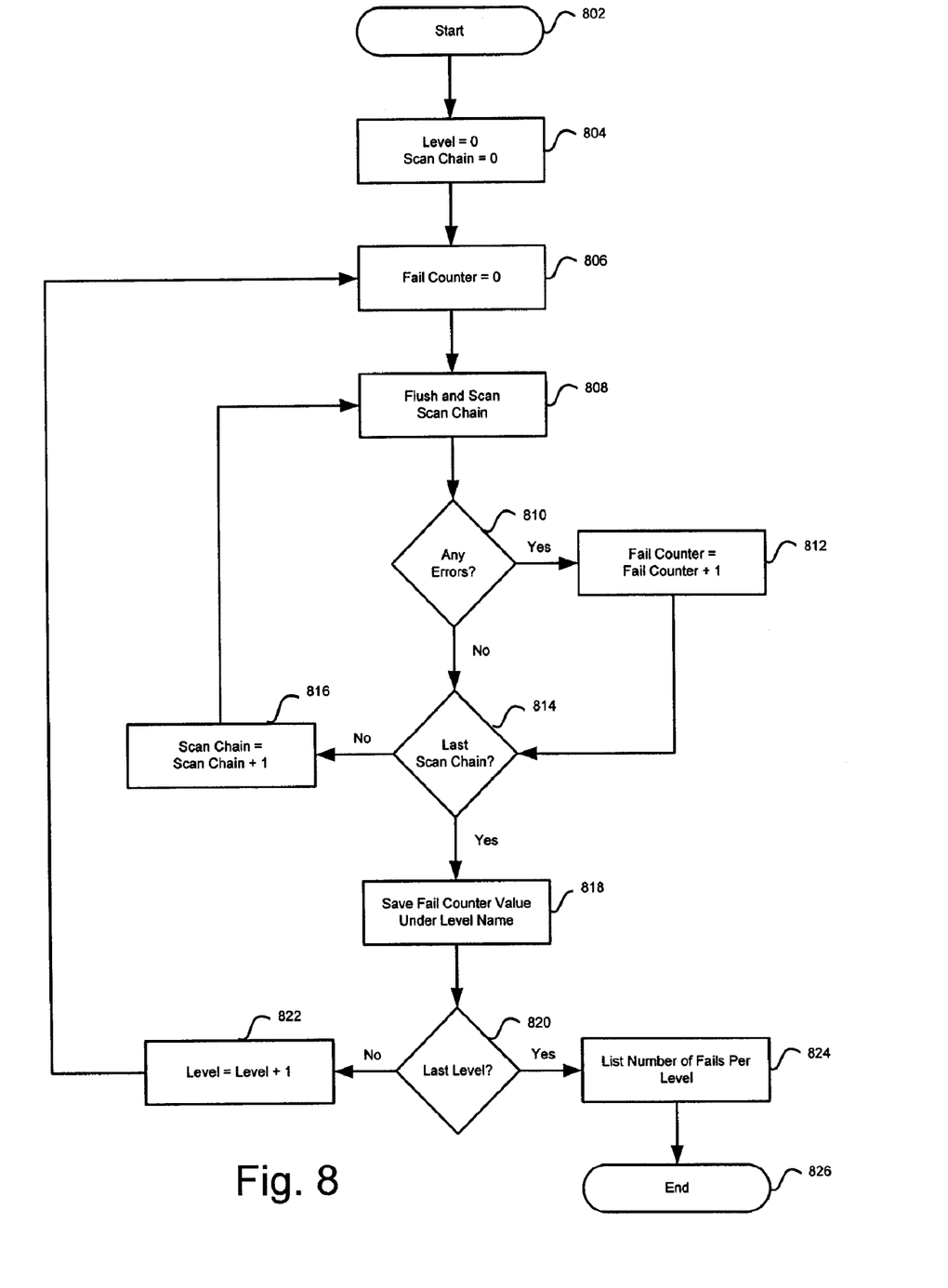
FIG. 8 is a flow-chart describing a method for assessing yield per wiring level in a wafer or chip determined by the number of scan chain failures per wiring level.

In a preferred embodiment, each scan chain is wired on a precise wiring level. This means that all wires leading into and out of each latch of a scan chain are on a given wiring level. Thus if there is a fail in the scan chain, it is very likely that the fail occurred in the given wiring level. Very often in the early stages of technology development, certain manufacturing levels will have systematic defects, that once corrected allow for higher overall manufacturing yield. By identifying which wiring levels have abnormally high scan chain failures (or parallel shifting mechanism failures), the wafer fabricator can identify, during the wafer manufacturing process, which wiring layer(s) need corrective steps to be taken in the manufacturing process. For instance, if Level 1 had 28 non-defective scan chains out of 32, Level 2 had 29 non-defective scan chains out of 32, and Level 3 had 21 non-defective scan chains out of 32, then a manufacturing engineer could first spend time diagnosing fails on Level 3 to explain the significantly lower yield. FIG. 8 depicts such an identification process. After starting at initiator block 802, the wiring level and scan chain number are first identified (block 804). The number of scan chain failures are initialized at zero (block 806), and the first scan chain is flushed and scanned (block 808). If there are any errors in the first scan chain (block 810), the counter for the number of scan chain errors for the first wiring level is increased by one (block 812), and the next scan chain in the wiring level is then examined (blocks 814 and 816, continuing to block 808 et seq.). When all of the scan chains in a wiring level have been examined for any errors (block 818), then the wiring level is incremented and the next level is examined for any scan chain errors (blocks 820, 822, and 824) until all levels have been examined. While the evaluation of each wiring level is shown as the number of scan chains having at least one defect, alternatively the evaluation of each wiring level can evaluate how many total defects in the scan chains are identified using the process described above for locating first upstream stuck-at defects, last downstream stuck-at errors, parallel shifting mechanism errors, and other errors, such as opens (broken wires that are not shorted to any other wire). Further, in a preferred embodiment, the scan chains are laid out in a predetermined X-Y Cartesian coordinate matrix. By identifying the location of the defect in the defective scan chain, and identifying which wiring level the scan chain is on, the manufacturing engineer of the circuit can identify specific physical problem areas of the circuit. The engineer can then make correcting adjustments to the manufacturing process, such as changing masks, thicknesses of strata, etc.

While the present invention has been described as locating stuck-at-low and stuck-at-high connector defects, the present invention is also useful in locating defective latches. That is, if a latch itself is stuck at high or low, then the downstream bits latched will be similar to those described for a stuck-at connector defect, and the process for locating the defective latch is the same as that used to locate the defective connector.

The present invention thus provides a way to specifically locate a wiring defect in a circuit. While the present invention has been described in the context of integrated circuits being evaluated either at the wafer or chip level in manufacturing, the present invention is also useful in identifying any analogous wiring defect in a circuit having parallel registers, chains or other state or bit storing units. Thus, a wiring level is preferably first identified according to the number of failures on that level. To focus with more precision on where the errors are occurring on the level, good and bad scan chains are identified, their parallel shifting mechanism is tested, and the process then locates the stuck-at defect as described above. This process permits precise identification of defect spots, which can then be addressed by the manufacturing engineers.

It should be understood that at least some aspects of the present invention may alternatively be implemented in a program product. Programs defining functions on the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such single-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

While the invention has been particularly shown and described with reference to a preferred embodiment, it will be understood by those skilled in the art that various changes in form and detail may be made therein without departing from the spirit and scope of the invention.

What is claimed is:

1. A circuit for identifying a defect location in a set of latches, said circuit comprising:

a first set of latches wired on a first wiring level;

a second set of latches wired on a second wiring level, each latch in the second set of latches being coupled with a corresponding latch in the first set of latches;

a controller that selectively parallel shifts the contents of the first set of latches into the second set of latches via a parallel shifting means;

a detector, coupled to an output of the second set of latches, that compares an output of the second set of latches with a predetermined bit sequence to identify a location of a defect in a defective set of latches, the defective set of latches being either the first or second set of latches, said detector further identifying whether a wiring of the defective set of latches is on the first wiring level or the second wiring level.

2. The circuit of claim 1, wherein the defect location is a defect location, from a plurality of defect locations, that is closest to the output of the defective set of latches.

3. The circuit of claim 1, wherein the defect location is a defect location, from a plurality of defect locations, that is farthest from the output of the defective set of latches.

4. The circuit of claim 1, wherein the defective set of latches is laid out in a pre-determined matrix, such that identification of the defect location identifies a Cartesian coordinate of a physical location of the defect in a circuit.

5. The circuit of claim 1, further comprising means that, if the first and second sets of latches are both defective, parallel shift the contents between the first set of latches and a non-defective third set of latches wired on a third wiring level.

6. The circuit of claim 1, wherein the defective set of latches contains a defect that prohibits a scan-in of data into all of the defective set of latches, wherein latches downstream of the defect contain data that do not correspond to the predetermined bit sequence.

7. The circuit of claim 1, further comprising means for checking the parallel shifting means.

8. A method for identifying a defect location in a set of latches, said method comprising:

scanning a first predetermined bit sequence into a defective first set of latches, the first set of latches being wired on a first wiring level;

parallel shifting the contents of the first set of latches into a second set of latches that is defect free, the second set of latches being wired on a second wiring level that is different from the first wiring level, wherein each latch in the second set of latches is coupled with a corresponding latch in the first set of latches;

scanning out the contents of the second set of latches; and comparing the scanned out contents of the second set of latches with the predetermined bit sequence, whereby a bit sequence of the scan output identifies a location of a first upstream defect in the first set of latches and a wiring level on which the first upstream defect occurs.

9. The method of claim 8, further comprising:

scanning a second predetermined bit sequence into the second set of latches;

parallel shifting the contents of the second set of latches into the first set of latches;

scanning out the contents of the first set of latches; and comparing the scan outputs of the first set of latches to identify a last downstream defect location in the first set of latches.

10. The method of claim 9, wherein the predetermined bit sequence scanned into the second set of latches are all ones.

11. The method of claim 9, wherein the predetermined bit sequence scanned into the second set of latches are all zeros.

12. The method of claim 9, wherein the location of the last downstream defect is determined by counting a number of scan shifts relative to the output of the first set of latches to determine the last downstream defect location in the first set of latches.

13. The method of claim 8, wherein the predetermined bit sequence scanned into the first set of latches are all ones.

14. The method of claim 8, wherein the predetermined bit sequence scanned into the first set of latches are all zeros.

15. The method of claim 8, wherein the location of the first upstream defect is determined by counting a number of scan shifts relative to the output of the second set of latches to determine the first upstream defect location in the first set of latches.

16. The method of claim 8, wherein the defective set of latches is laid out in a pre-determined matrix, such that identification of the defect location identifies a Cartesian coordinate of a physical location of the defect in a circuit.

17. The method of claim 8, further comprising: testing a means for said parallel shifting for defects.

18. A computer program product, residing on a computer usable medium, for identifying a defect location in a set of latches, said computer program product comprising:

program code for scanning a predetermined bit sequence into a first set of latches having a defect, said first set of latches being wired on a first wiring level;

program code for parallel shifting the contents of the first set of latches into a second set of latches that is defect free, said second set of latches being wired on a second wiring level, wherein each latch in the second set of latches is coupled with a corresponding latch in the first set of latches;

program code for scanning out the contents of the second set of latches; and program code for comparing the scanned out contents of the second set of latches with the predetermined bit sequence, whereby a bit sequence of the scan output identifies a first upstream defect location in the first set of latches.

19. The computer program product of claim 18, further comprising:

program code for scanning a predetermined bit sequence into the second set of latches;

program code for parallel shifting the contents of the second set of latches into the first set of latches;

program code for scanning out the contents of the first set of latches; and program code for comparing the scan outputs of the first set of latches to identify a last downstream defect location in the first set of latches.

20. The computer program product of claim 19, wherein the predetermined bit sequence scanned into the second set of latches are all ones.

21. The computer program product of claim 19, wherein the predetermined bit sequence scanned into the second set of latches are all zeros.

22. The computer program product of claim 19, wherein the location of the last downstream defect is determined by counting a number of scan shifts relative to the output of the first set of latches to determine the last downstream defect location in the first set of latches.

23. The computer program product of claim 18, wherein the predetermined bit sequence scanned into the first set of latches are all ones.

24. The computer program product of claim 18, wherein the predetermined bit sequence scanned into the first set of latches are all zeros.

25. The computer program product of claim 18, wherein the location of the first upstream defect is determined by counting a number of scan shifts relative to the output of the second set of latches to determine the first upstream defect location in the first set of latches.

26. The computer program product of claim 19, wherein the first and second sets of latches are on different wiring layers of a same integrated circuit.

27. The computer program product of claim 26, further comprising program code for determining which layer of the different wiring layers is more defective that other wiring layers by counting the number of defective scan chains in each layer.

28. The computer program product of claim 26, further comprising:

program code for testing a means for said parallel shifting for defects.

29. A method for identifying a defect location in a set of latches, said method comprising:

scanning a predetermined bit sequence into a first set of latches that is connection defect free, the first set of latches being wired on a first wiring level;

parallel shifting contents of the first set of latches into a second set of latches that has a defect, the second set of latches being wired on a second wiring level, wherein each latch in the second set of latches is coupled with a corresponding latch in the first set of latches;

scanning out the contents of the second set of latches; and comparing the scan output of the second set of latches with the predetermined bit sequence to identify a last downstream defect location in the second set of latches.

* * * * *